(12) United States Patent
Wellens et al.

(10) Patent No.: US 12,658,554 B2
(45) Date of Patent: Jun. 16, 2026

(54) SPOILER OF A VEHICLE

(71) Applicant: VALEO COMFORT AND DRIVING ASSISTANCE, Créteil (FR)

(72) Inventors: Matthias Wellens, Créteil (FR); Hubert Gleich, Créteil (FR); Walter Reichert, Créteil (FR); Dirk Wischnewski, Créteil (FR); Marcus Och, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 517 days.

(21) Appl. No.: 18/017,504

(22) PCT Filed: Jun. 14, 2021

(86) PCT No.: PCT/EP2021/065964
§ 371 (c)(1),
(2) Date: Jan. 23, 2023

(87) PCT Pub. No.: WO2022/017685
PCT Pub. Date: Jan. 27, 2022

(65) Prior Publication Data
US 2023/0282956 A1     Sep. 7, 2023

(30) Foreign Application Priority Data
Jul. 23, 2020     (EP) .................................... 20187461

(51) Int. Cl.
*B62D 35/00*        (2006.01)
*H01Q 1/02*         (2006.01)
(Continued)

(52) U.S. Cl.
CPC ............. *H01Q 1/02* (2013.01); *B62D 35/007* (2013.01); *H01Q 1/3291* (2013.01); *H01Q 23/00* (2013.01); *H05K 7/20* (2013.01)

(58) Field of Classification Search
CPC ............ H05K 7/20145; H05K 7/20918; H01L 23/34; H01L 23/36; H01L 23/367;
(Continued)

(56) References Cited

U.S. PATENT DOCUMENTS 3,837,395 A * 9/1974 Coolidge ................. F01P 11/08
                                                                165/47
4,962,903 A * 10/1990 Byron ....................... B64C 3/36
                                                                244/210
(Continued)

FOREIGN PATENT DOCUMENTS

CN            1878695 A      12/2006
WO      WO-2020089585 A1 *  6/2020   ............. H01Q 21/28

OTHER PUBLICATIONS

International Search Report and Written Opinion in corresponding International Application No. PCT/EP2021/065964, dated Aug. 23, 2021 (12 pages).

(Continued)

*Primary Examiner* — Jayprakash N Gandhi
(74) *Attorney, Agent, or Firm* — Osha Bergman Watanabe & Burton LLP

(57)                ABSTRACT

The invention relates to a spoiler (1) of a vehicle (V) comprising a body and an electronic component, wherein the body comprises a cavity, wherein the electronic component is arranged in this cavity, wherein the spoiler comprises an outer recess and the spoiler comprises an outer heat sink, wherein the outer heat sink is arranged in the outer recess of the body and wherein the outer recess passes over into the cavity.

8 Claims, 5 Drawing Sheets

(51) Int. Cl.

| | |
|---|---|
| *H01Q 1/32* | (2006.01) |
| *H01Q 23/00* | (2006.01) |
| *H05K 7/20* | (2006.01) |

(58) Field of Classification Search
CPC ....... H01L 23/373; H01L 23/40; H01L 23/46; H01L 23/467; G06F 1/20; G06F 1/203; G06F 1/206; H01Q 1/02; H01Q 1/3291; H01Q 23/00; B62D 35/007; B60K 11/04; B60K 11/06
See application file for complete search history.

(56) References Cited

U.S. PATENT DOCUMENTS

| | | | |
|---|---|---|---|
| 6,505,696 B1 | 1/2003 | Prevost | |
| 2006/0196633 A1* | 9/2006 | Mahjoub | B64C 7/00 |
| | | | 165/41 |
| 2013/0062132 A1* | 3/2013 | Wolf | F01P 3/18 |
| | | | 180/68.1 |
| 2013/0068547 A1* | 3/2013 | Wolf | F02B 29/0431 |
| | | | 180/68.4 |
| 2015/0232191 A1* | 8/2015 | Wetzel | H01M 10/6563 |
| | | | 62/61 |
| 2016/0229285 A1* | 8/2016 | Rutschmann | F02B 29/0431 |
| 2019/0027818 A1 | 1/2019 | Ortigosa et al. | |
| 2023/0120700 A1* | 4/2023 | Grusser | H05K 7/20872 |
| | | | 361/699 |

OTHER PUBLICATIONS

Office Action issued in corresponding China Application No. 202180047270.6, dated Feb. 6, 2026. (18 pages).

* cited by examiner

SPOILER OF A VEHICLE

FIELD OF THE INVENTION

The present disclosure relates to a spoiler of a vehicle.

BACKGROUND OF THE INVENTION

From US 2019/027818 A1 it is known to arrange a TCU in a cavity of a spoiler.

SUMMARY OF THE INVENTION

It is an object of the invention to propose a spoiler of a vehicle which allows to improve the functional availability of a telematics system.

The invention provides a spoiler of a vehicle comprising a body and an electronic component, wherein the body comprises a cavity, wherein the electronic component is arranged in this cavity, wherein the spoiler comprises an outer recess, wherein the spoiler comprises an outer heat sink, wherein the outer heat sink is arranged in the outer recess of the body and wherein the outer recess passes over into the cavity. Such a spoiler is appropriate to enhance the thermal management of a telematics system since the electronic component which is part of the spoiler can be cooled efficiently.

It is further provided that the body of the spoiler comprises an inner recess and the spoiler comprises an inner heat sink, wherein the inner heat sink is arranged in the inner recess of the body and the inner recess passes over into the cavity and wherein the cavity is arranged between the outer recess and the inner recess. The second heat sink enhance the cooling capacity of the spoiler.

It is further provided that the outer heat sink forms a part of a skin of the body or the outer heat sink is covered by a skin of the body. Such a positioning of the outer heatsink provides an efficient cooling since the heat sink can be cooled directly or nearly directly by the air stream.

It is further provided that the body comprises a cooling channel structure, wherein the inner recess is arranged between the cavity and a middle section of the cooling channel structure and wherein the cooling channel structure comprises at least one inlet and at least one outlet. The cooling capacity is enhanced by a cooling channel structure. This means that cooling is more effective.

It is further provided that the inlet and the outlet are positioned in such a way on the spoiler that an airflow is generated in the cooling channel structure by the airstream, wherein the inlet is located in a frontside area of the body of the spoiler in which overpressure is generated by the airstream and wherein the outlet is located in a backside area of the body of the spoiler in which the pressure is lower than the overpressure. Such an arrangement generates a highly effective cooling.

It is further provided that the inlet and the outlet are positioned in such a way on the spoiler that an airflow is generated in the cooling channel structure by the airstream, wherein the outlet is located in a frontside area of the body of the spoiler in which suction is generated by the airstream and the inlet is located in a backside area of the body of the spoiler in which air can be sucked in. Such an arrangement generates a highly effective cooling.

It is further provided that the spoiler comprises a fan, wherein the fan is arranged either in the cooling channel structure or outside the body at the outlet or at the inlet of the cooling channel structure, whereby in the case that the fan is located outside the body of the spoiler the fan comprises a housing which is shaped aerodynamically and complements the body. Such an arrangement allows to continue efficient cooling during parking of the vehicle or during a traffic jam. Additionally the location of the fan in the spoiler has the advantage that the fan would not be audible in an interior of the vehicle since there is no direct connection between the spoiler and the interior of the vehicle.

It is further provided that the electronic component comprises antennas or a TCU or antennas and a TCU or antennas and a TCU and additional electronics e.g. at least one amplifier, wherein for the case that the electronic component comprises antennas and the TCU the antennas are housed in the cavity adjacent to the outer heat sink and the TCU is housed in the cavity adjacent to the inner heat sink. Such an architecture guaranties a reliable cooling of the TCU.

Further it is provided that the least one amplifier is arranged in the cavity either near to the TCU and near to the inner heat sink or near to the antennas and near to the outer heat sink. Such an architecture allows an efficient cooling of a greater part of the electronics which are necessary for telematics functions and especially of the amplifiers for the antennas.

According to another embodiment it is provided that a first cooling channel structure is positioned in such a way that the TCU is cooled and at least one additional cooling channel structure is positioned in such a way that at least one antenna and/or at least one amplifier is cooled. Such an arrangement with multiple cooling channel structures makes the cooling more effective and allows to dimension each cooling channel structure with respect to the necessary cooling capacity.

According to the invention a TCU is an embedded system on board of a vehicle that provides radio communication capabilities to the vehicle to. e.g., access the Internet.

According to the invention an electronic component comprises at least one electronic unit and for example as a first electronic unit a TCU and as a second electronic unit antennas and optionally as a third electronic unit amplifiers.

BRIEF DESCRIPTION OF THE DRAWINGS

The foregoing and other features and advantages of the present invention will become apparent to those skilled in the art to which the present invention relates upon reading the following description with reference to the accompanying drawing, in which:

FIG. 1 shows a spoiler 1 of a vehicle V, which is mounted to the roof R of the vehicle V and is representative for the spoilers shown in FIGS. 2 to 5.

FIG. 2 shows in a cutting view schematically a first embodiment of an inventive spoiler 101 of a vehicle V, wherein the spoiler 101 is designed generally similar to the spoiler 1 shown in FIG. 1.

Figure 1:
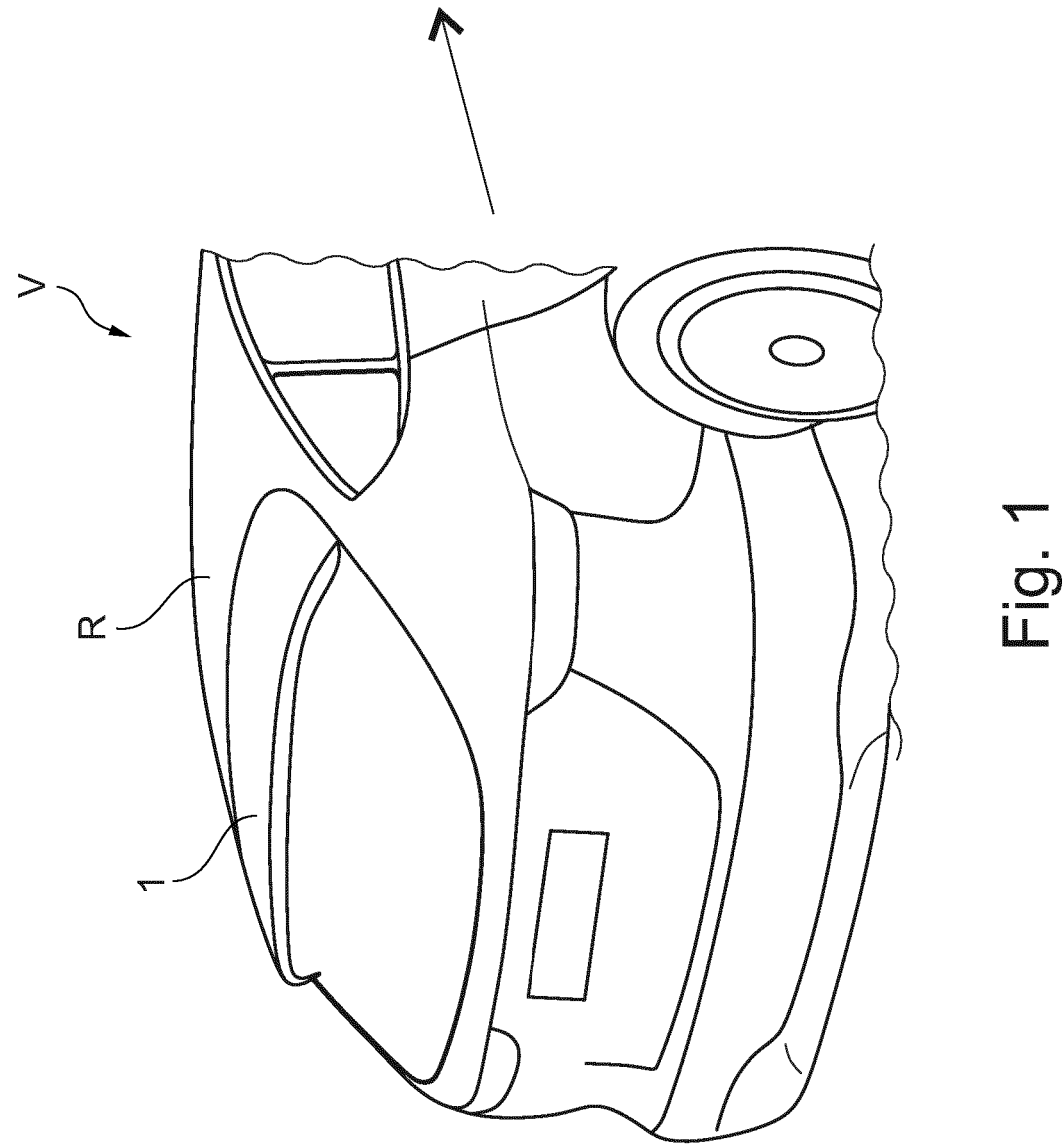
FIG. 1 shows a spoiler of a vehicle, which is mounted to a roof of a vehicle.
Figure 2:
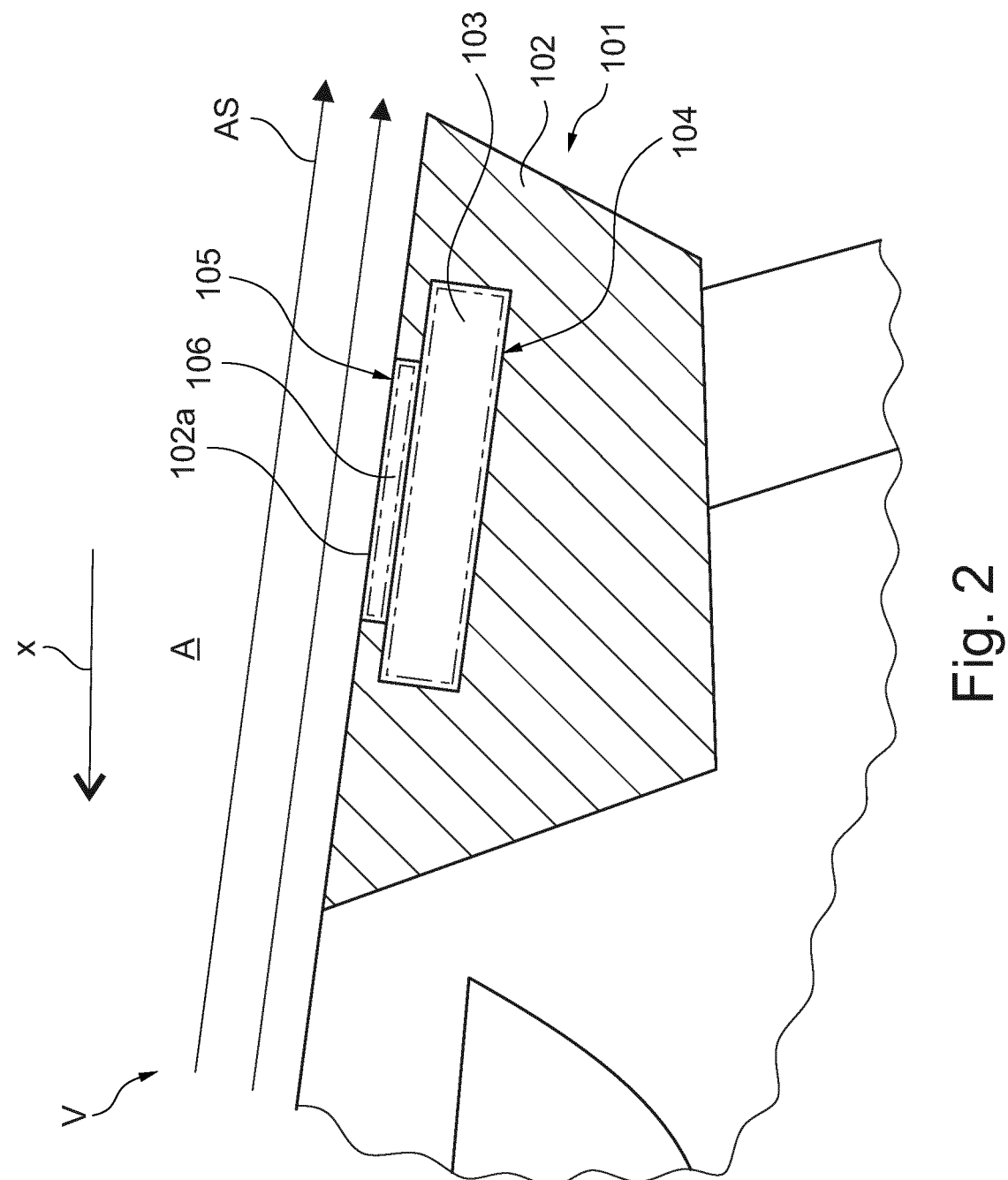
FIG. 2 shows in a cutting view schematically a first embodiment of an inventive spoiler.

The Spoiler 101 comprises a body 102 and an electronic component 103. The body 102 comprises a cavity 104, wherein the electronic component 103 is arranged in this cavity 104. Additionally the spoiler 101 comprises an outer recess 105 and that the spoiler comprises an outer heat sink 106, wherein the outer heat sink 106 is arranged in the outer recess 105 of the body 102 and wherein the outer recess 105 passes over into the cavity 104.

The electronic component 103 is cooled by the heat sink 106 which is in contact with a bottom side of a skin 102a of the body 102 of the spoiler 101. Heat that is generated by the electronic component 103 is conveyed via the outer heat sink 106 through the skin 102a of the body 102 to a top side of the skin 102a and from the top side of the skin 102a to the ambient air A, wherein the cooling effect is enlarged when the vehicle V moves and an airstream AS cools the skin 102a of the body 102 in an area of the heat sink 106.

According to an embodiment that is not shown the heat sink forms a part of a skin of the body of the spoiler and the heat is directly transferred from the heat sink to the ambient air.

Figure 3:
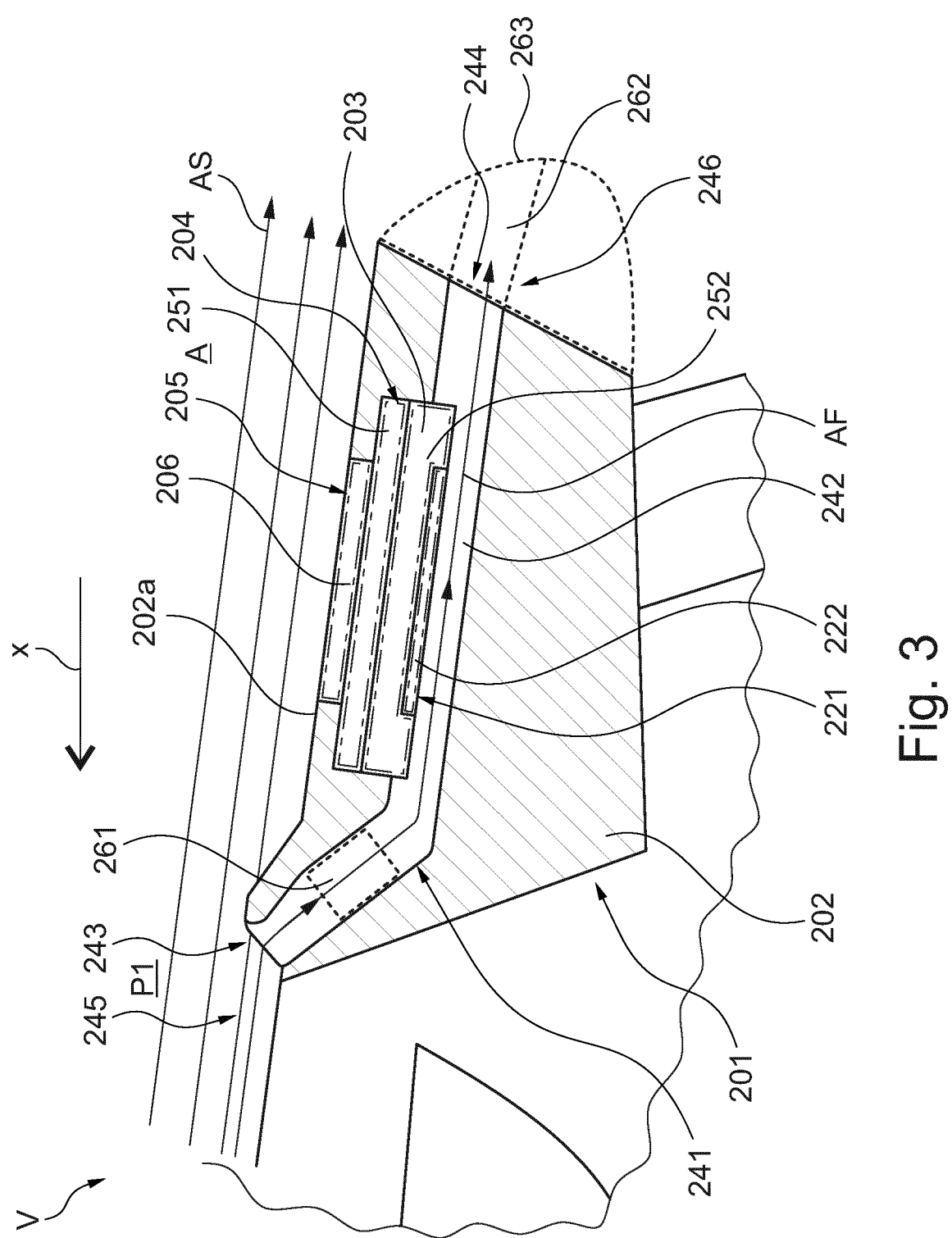
FIG. 3 shows in a cutting view schematically a second embodiment of an inventive spoiler.

FIG. 3 shows in a cutting view schematically a second embodiment of an inventive spoiler 201 of a vehicle V.

The Spoiler 201 comprises a body 202 and an electronic component 203. The body 202 comprises a cavity 204, wherein the electronic component 203 is arranged in this cavity 204. The spoiler 201 comprises an outer recess 205 and the spoiler comprises an outer heat sink 206, wherein the outer heat sink 206 is arranged in the outer recess 205 of the body 202 and wherein the outer recess 205 passes over into the cavity 204. Additionally the spoiler 201 comprises an inner recess 221 and the spoiler 201 comprises an inner heat sink 222, wherein the inner heat sink 222 is arranged in the inner recess 221 of the body 202 and the inner recess 221 passes over into the cavity 204 and wherein the cavity 204 is arranged between the outer recess 205 and the inner recess 221.

The electronic component 203 is cooled by the heat sink 206 which is in contact with a skin 202a of the body 202 of the spoiler 201. Heat that is generated by the electronic component 203 is conveyed through the skin 202a to ambient air A, wherein the cooling effect is enlarged when the vehicle V moves and an airstream AS cools the skin 202a of the body 202 in an area of the heat sink 206.

According to an embodiment that is not shown the heat sink forms the surface of the body and the heat is directly transferred to the ambient air. Thus the heat sink forms a part of the surface of the body of the spoiler.

Additionally the body 202 comprises a cooling channel structure 241, wherein the inner recess 221 is arranged between the cavity 204 and a middle section 242 of the cooling channel structure 241 and wherein the cooling channel structure 241 comprises an inlet 243 and an outlet 244. Thus the inner heat sink 222 is cooled by ambient air A flowing through the cooling channel structure 241.

The inlet 243 and the outlet 244 are positioned in such a way on the body 202 of the spoiler 201 that an airflow AF is generated in the cooling channel structure 241 by the airstream AS, wherein the inlet 243 is located in a frontside area 245 of the body 202 of the spoiler 201 in which overpressure P1 is generated by the airstream AS. The outlet is located opposite to the inlet 243 in a backside area 246 of the body 202 of the spoiler 201. The airstream AS and the airflow AF run in much in the same direction, namely in the direction of the airstream AS.

The electronic component 203 comprises antennas 251 and a TCU 252, wherein antennas 251 are housed in the cavity 204 adjacent to the outer heat sink 206 and the TCU 252 is housed in the cavity 204 adjacent to the inner heat sink 222.

According to a first optional embodiment of FIG. 3 the spoiler 201 may comprise an electric fan 261 (shown in dotted lines), wherein the fan 261 is arranged in the cooling channel structure 241 between the inlet 243 and the middle section 242 of the cooling channel structure 241 and shown by dotted lines. According to one possible embodiment the fan will be active, when the vehicle V is stationary and the electronic component 203 is active. The fan 261 may be additionally controlled by a temperature sensor.

According to a second optional embodiment of FIG. 3 which can be realized as alternative to the first optional embodiment of FIG. 3 the spoiler 201 may comprise an electric fan 262 (shown in dotted lines), wherein the fan 262 is arranged outside the body 202 at the outlet 244 of the cooling channel structure 241. The fan 262 comprises a housing 263 which is shaped aerodynamically and complements the body 202 of the spoiler 201. According to one possible embodiment the fan 262 will be active, when the vehicle V is stationary and the electronic component 203 is active. The fan 262 may be additionally controlled by a temperature sensor.

Figure 4:
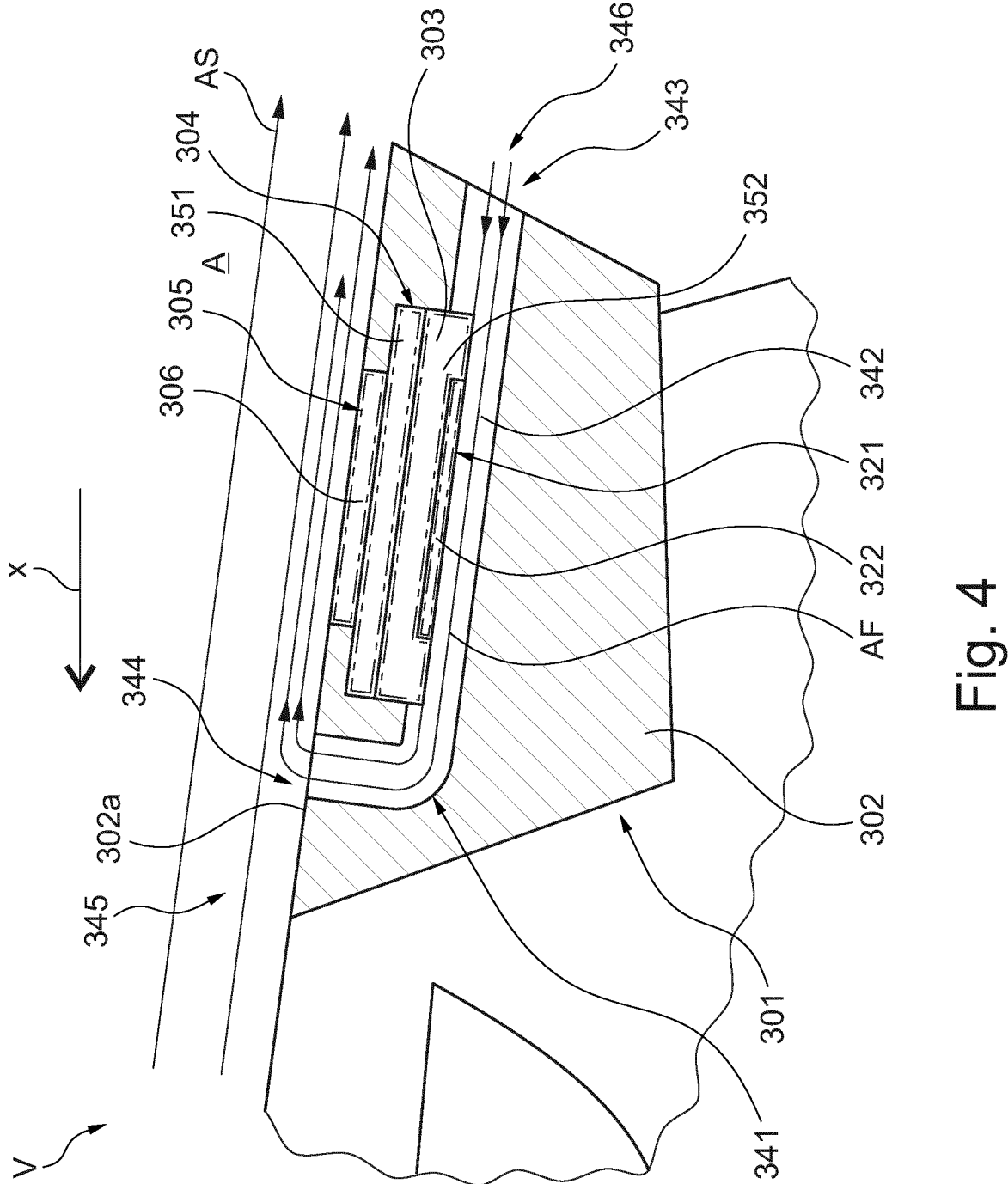
FIG. 4 shows in a cutting view schematically a third embodiment of an inventive spoiler and FIG. 5 shows in a top view a forth embodiment of an inventive spoiler.

FIG. 4 shows in a cutting view schematically a third embodiment of an inventive spoiler 301 of a vehicle V.

The Spoiler 301 comprises a body 302 and an electronic component 303. The body 302 comprises a cavity 304, wherein the electronic component 303 is arranged in this cavity 304. The spoiler 301 comprises an outer recess 305 and the spoiler comprises an outer heat sink 306, wherein the outer heat sink 306 is arranged in the outer recess 305 of the body 302 and wherein the outer recess 305 passes over into the cavity 304. Additionally the spoiler 301 comprises an inner recess 321 and the spoiler 301 comprises an inner heat sink 322, wherein the inner heat sink 322 is arranged in the inner recess 321 of the body 302 and the inner recess 321 passes over into the cavity 304 and wherein the cavity 304 is arranged between the outer recess 305 and the inner recess 321.

The electronic component 303 is cooled by the outer heat sink 306 which is in contact with a skin 302a of the body 302 of the spoiler 301. Heat that is generated by the electronic component 303 is conveyed via the outer heat sink 306 through the skin 302a to ambient air A, wherein the cooling effect is enlarged when the vehicle V moves and an airstream AS cools the skin 302a of the body 302 in an area of the heat sink 306.

According to an embodiment that is not shown the heat sink forms the surface of the body and the heat is directly transferred to the ambient air. Thus the heat sink forms a part of the surface of the body of the spoiler.

Additionally the body 302 comprises a cooling channel structure 341, wherein the inner recess 321 is arranged between the cavity 304 and a middle section 342 of the cooling channel structure 341 and wherein the cooling channel structure 341 comprises an inlet 343 and an outlet 344. Thus the inner heat sink 322 is cooled by ambient air A flowing through the cooling channel structure 341.

The inlet 343 and the outlet 344 are positioned in such a way on the body 302 of the spoiler 301 that an airflow AF is generated in the cooling channel structure 341 by the airstream AS, wherein the inlet 343 is located in a backside area 346 of the body 302 of the spoiler 301. The outlet 344 is located opposite to the inlet 343 in a frontside area 345 of the body 302 of the spoiler 301. The airstream AS and the airflow AF run in much in the opposite directions. The airstream AS runs opposite to a moving direction x of the vehicle V and the airflow AF runs in the moving direction x of the vehicle V. In order to generate such a reverse airflow AF the outlet is positioned in such a way that a Venturi effect is generated and suction is generated by the airstream at the outlet.

The electronic component 303 comprises antennas 351 and a TCU 352, wherein antennas 351 are housed in the cavity 304 adjacent to the outer heat sink 306 and the TCU 352 is housed in the cavity 304 adjacent to the inner heat sink 322.

Figure 5:
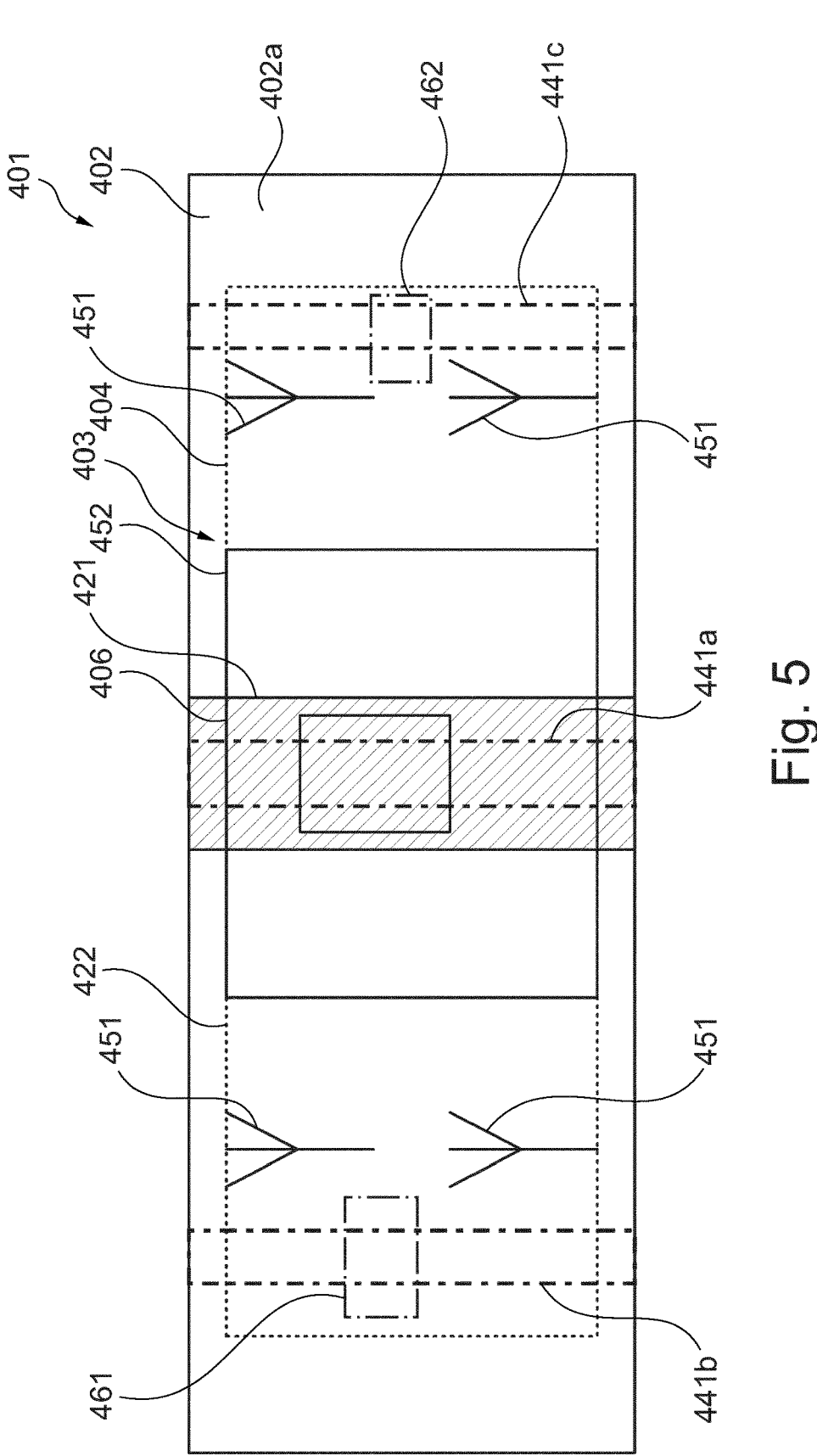

FIG. 5 shows in a top view schematically a forth embodiment of an inventive spoiler 401 of a vehicle. The spoiler 401 is symbolized by a rectangular outline. The spoiler 401 comprises a body 402 and an outer recess 421 and a cavity 404. The outer recess 421 houses an outer heat sink 406 which lies below a skin 402*a* of the body which is shown in a transparent manner. The cavity 404 lies below the outer recess 421 and houses a TCU 452 as a first part of an electronic component 403 and houses antennas 451 as a second part of the electronic component 403. Wherein the TCU 452 is in direct contact with the outer heat sink 406 and the antennas 451 are arranged next to the TCU 452 and are cooled by the outer heat sink 406 via the TCU 452.

According to a first optional embodiment the spoiler 401 comprises two amplifiers 461, 462 which are arranged in the cavity 404 near to the antennas 451 and are cooled via antennas 451 and the TCU 452.

According to a second optional embodiment the spoiler 401 comprises additionally or alternatively to the outer heat sink 406 an inner heat sink 422 which is positioned adjacent to the TCU 452, to the antennas 451 and to the amplifiers 461, 462. The spoiler 401 comprises according to the second optional embodiment a first cooling channel structure 441*a*, a second cooling channel structure 441*b* and a third cooling channel structure 441*c*. The inner heat sink 422 is cooled by the first cooling channel structure 441*a*, the second cooling channel structure 441*b* and the third cooling channel structure 441*c*, wherein the second and the third cooling channel structures 441*b*, 441*c* are additional cooling channel structures with respect to the first cooling channel structure 441*a*. The TCU 452 is mainly cooled by the first cooling channel structure 441*a*. The left side antennas 451 and the amplifier 461 are mainly cooled by the second cooling channel structure 441*b* and the right side antennas 451 and the amplifier 462 are mainly cooled by the third cooling channel structure 441*c*. The cooling channel structures 441*a*, 441*b* and 441*c* are designed similar to the cooling channel structure shown in FIG. 3 or 4.

REFERENCE NUMERALS 1 spoiler
A ambient air
AF airflow
AS airstream
P1 overpressure
R roof of V
V vehicle
x moving direction of V
101 spoiler (first embodiment)
102 body of
102*a* skin of 102

103 electronic component
104 cavity in 102
105 outer recess in 102
106 outer heat sink
201 spoiler (second embodiment)
202 body of 201
202*a* skin of 202
203 electronic component
204 cavity in 202
205 outer recess in 202
206 outer heat sink
221 inner recess
222 inner heat sink
241 cooling channel structure
242 outlet of 241
243 inlet of 241
244 outlet of 241
245 frontside area
246 backside area
251 antennas
252 TCU
261 fan
262 fan
263 housing of 262
301 spoiler (third embodiment)
302 body of 301
302*a* skin of 302
303 electronic component
304 cavity in 302
305 outer recess in 302
306 outer heat sink
321 inner recess
322 inner heat sink
341 cooling channel structure
342 middle section of 341
343 inlet of 341
344 outlet of 341
345 frontside area
346 backside area
351 antennas
352 TCU
401 spoiler (forth embodiment)
402 body of 401
402*a* skin of 402
403 electronic component
404 cavity
406 outer heat sink
421 outer recess
422 inner heat sink
441*a* first cooling channel structure
441*b* second cooling channel structure
441*c* third cooling channel structure
451 antennas
452 TCU
461, 462 amplifier

The invention claimed is:

1. A spoiler of a vehicle comprising:
a body comprising:
an outer recess that passes over into a cavity,
the cavity arranged between the outer recess and an inner recess,
the inner recess arranged between the cavity and a cooling channel structure and that passes over into the cavity, and
the cooling channel structure comprising:
an inlet located in a backside area of the body; and
an outlet located in a frontside area of the body, wherein the inlet and the outlet are positioned so that an airflow is generated in the cooling channel structure by an airstream, and wherein the airflow and the airstream run in opposite directions;

an electronic component arranged in the cavity;

an outer heat sink arranged in the outer recess; and an inner heat sink arranged in the inner recess.

2. The spoiler according to claim 1, wherein the outer heat sink forms a part of a skin of the body or the outer heat sink is covered by the skin of the body.

3. The spoiler according to claim 1, wherein the inner recess is arranged between the cavity and a middle section of the cooling channel structure.

4. The spoiler according to claim 3, wherein a suction is generated by the airstream at the outlet.

5. The spoiler according to claim 3, wherein the spoiler comprises a fan, wherein the fan is arranged either in the cooling channel structure, outside the body at the outlet or at the inlet of the cooling channel structure, whereby in the case that the fan is located outside the body of the spoiler the fan comprises a housing which is shaped aerodynamically and complements the body.

6. The spoiler according to claim 3, wherein the cooling channel structure comprises: a first cooling channel structure is positioned so that a TCU is cooled; and at least one additional cooling channel structure is positioned so that at least one antenna and/or at least one amplifier is cooled.

7. The spoiler according to claim 1, wherein the electronic component comprises antennas, a TCU, and an amplifier, and wherein for the case that the electronic component comprises the antennas and the TCU, the antennas are housed in the cavity adjacent to the outer heat sink and the TCU is housed in the cavity adjacent to the inner heat sink.

8. The spoiler according to claim 7, wherein the amplifier is arranged in the cavity either near to the TCU and near to the inner heat sink, or near to the antennas and near to the outer heat sink.

* * * * *